Oct. 13, 1970 A. LE ROY LIMBERG 3,534,245

ELECTRICAL CIRCUIT FOR PROVIDING SUBSTANTIALLY CONSTANT CURRENT

Filed Dec. 8, 1967 2 Sheets-Sheet 1

INVENTOR

Allen L. Limberg

BY Charles Brodsky

ATTORNEY

INVENTOR
Allen L. Limberg
BY Charles Brodsky
ATTORNEY

United States Patent Office 3,534,245
Patented Oct. 13, 1970

3,534,245
ELECTRICAL CIRCUIT FOR PROVIDING SUBSTANTIALLY CONSTANT CURRENT

Allen LeRoy Limberg, Somerville, N.J., assignor to RCA Corporation, a corporation of Delaware Filed Dec. 8, 1967, Ser. No. 689,168
Int. Cl. G05f *1/58*
U.S. Cl. 323—4 10 Claims

ABSTRACT OF THE DISCLOSURE

An electrical circuit including an avalanche diode, a resistor, and a predetermined number of forward biased semiconductor junction voltage drops for providing a constant current flow independent of temperature and supply voltage variations.

This invention relates to electrical circuits and, more particularly, to current sources which utilize the precise matching and close thermal coupling available in integrated circuits to provide stable operation in the presence of temperature and supply voltage variations.

As used herein, the term integrated circuit refers to a unitary or monolithic semiconductor device or chip which is the equivalent of a network of interconnected active and passive circuit elements. Various problems have presented themselves in the design of amplifier circuits to be formed in an integrated circuit device. For example, in common emitter amplifiers, the use of substantial direct current (D-C) degeneration and a bypass capacitor to reduce degeneration at the frequencies to be amplified is objectionable in some applications. For one thing, the capacitor occupies considerable area on the integrated circuit device, even for a relatively small amount of capacitance. Past attempts to overcome this problem by using differential or emitter-coupled amplifier connections suffered from a lack of versatility. Biasing techniques also employed proved to be temperature sensitive or dependent upon the regulation of supplied operating potentials for acceptable performance, or both.

As will become clear hereinafter, a current source constructed in accordance with the invention is based upon the fact that the various components fabricated in an integrated circuit structure exhibit defineable temperature dependencies. Resistors, for example, increase in value with increasing temperature, while the forward voltage drop across a semiconductor junction decreases. Decreasing temperatures, on the other hand, decrease resistance values and increase forward voltage drops. Avalanche diodes (e.g. a Zener diode), furthermore, can be made to exhibit either a positive or a negative temperature coefficient, depending upon their reverse-breakdown voltage and upon the current flowing through them.

Using this fact, and taking advantage of the close matching of, and excellent thermal coupling between, active and passive components in an integrated circuit fabrication, a current source may be constructed to provide a constant current although temperature and supply voltages vary.

In a first monolithic silicon integrated circuit embodiment of the invention, the current source is constructed using three serially coupled diode-connected transistors to effectively offset the temperature dependency of a resistor employed to set the value of output current and of an avalanche diode employed to isolate the source from supply voltage variations. In a second monolithic silicon integrated circuit embodiment, a unique transistor feedback stage is used to simulate 2.82 serially coupled diode-connected transistors to substantially offset temperature dependencies. As will subsequently be made clear, the number of diode-connected transistors to be included (as in the first embodiment) or to be simulated (as in the second embodiment) will depend upon the semiconductor material employed for the integrated circuit chip, or upon the reverse-breakdown voltage of the avalanche diode and/or upon the current flowing through that device.

For a better understanding of the present invention, reference is had to the following description taken in connection with the accompanying drawings, and its scope will be pointed out in the appended claims:

Referring to the drawings.

Figures 1, 2:
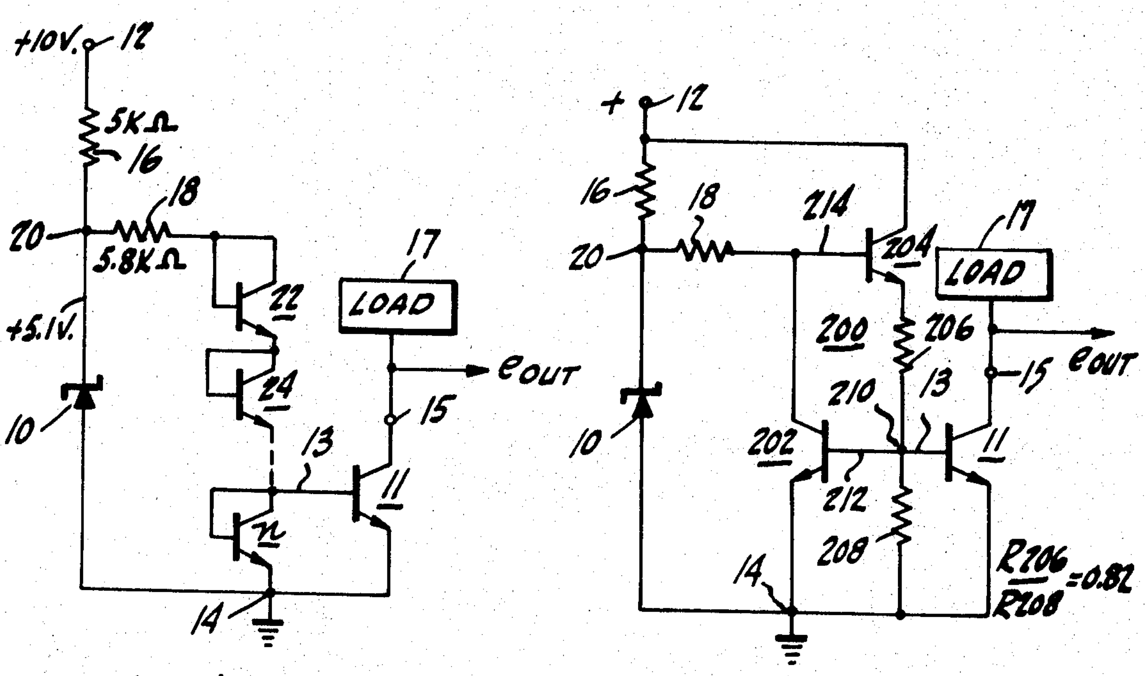
FIG. 1 is a schematic circuit diagram of a current source embodying the invention.
FIG. 2 is a schematic circuit diagram of a modification of the current source of FIG. 1.

Referring now to FIG. 1, the current source is preferably fabricated in an integrated circuit structure. The source includes an avalanche diode 10 serially coupled between an operating potential terminal 12 and a reference, or ground, potential terminal 14 by means of a first resistor 16. A second resistor 18 is connected at one end to the common junction 20 between the diode 10 and the resistor 16, and at the other end to the collector electrode of the first of a number of series coupled transistors 22, 24 . . . *n*. Each of the transistors 22, 24 . . . *n* is shown as having common collector and base electrode connections and each, therefore, effectively operates as a rectifier. The emitter electrode of the diode-connected transistor *n* is shown connected to the ground terminal 14, to which there is also connected the emitter electrode of a further transistor 11. The base electrode of the transistor 11 is connected by a lead 13 to the base electrode of diode-connected transistor *n*, while the collector electrode of the transistor 11 is connected by an output point 15 to a load 17. The manner of implementing these various transistor, diode and resistor functional portions in a monolithic integrated chip is well known in the art, as is the manner of forming their interconnections.

In the general operation of the current source of FIG. 1, a direct voltage which is more positive than the reverse-breakdown voltage of the avalanche diode 10 is applied at terminal 12. A regulated potential substantially equal to that reverse-breakdown voltage is developed at the common junction 20, and is of a value sufficient to cause current flow through the series circuit including resistor 18 and the diode-connected transistors 22, 24 . . . *n*. Since the base-emitter junction of transistor *n* is connected in parallel with the base-emitter junction of transistor 11, and since these two transistors are closely matched and tightly thermally coupled in an integrated circuit structure, the collector current in transistor 11 will be identical to that in transistor *n*. The operating current of the source, i.e., the collector current in transistor 11, can then be determined at a temperature $T_1$ from the expression for the collector current of transistor *n*, namely:

$$I_1 = \frac{V_{rb} - mV_{be}}{R} \quad (1)$$

where $I_1$=the collector current in transistor *n*, in milliamperes;

$V_{rb}$=the reverse-breakdown voltage of the avalanche diode 10, in volts;

$V_{be}$=the forward base-to-emitter voltage drop of each of the serially coupled diode-connected transistors 22, 24 . . . $n$;

$m$=the number of diode-connected transistors in the series coupling; and

R=the resistance value of resistor 18, in kilohms.

As was previously mentioned, this value of current can be stabilized in the presence of temperature variations by taking advantage of the defineable temperature dependencies of the components which play a part in the above expression. To be more specific, consonant with a change in environmental temperature is a change in value of each of the comonent parts of expression (1). The operating current of the source at a different temperature $T_2$ can then be represented by the equation $$I_2=\frac{(V_{rb}+\Delta V_{rb})-m(V_{be}+\Delta V_{be})}{R+\Delta R} \quad (2)$$

where $\Delta V_{rb}$, $\Delta V_{be}$ and $\Delta R$ represent the variations in $V_{rb}$, $V_{be}$ and R, respectively, as the temperature changes from $T_1$ to $T_2$, and where $I_2$ represents the collector current in transistor $n$ at the new temperature $T_2$. In order for the operating current of the source to be stable in the presence of such temperature change, it becomes apparent that $I_1$ must equal $I_2$. That is, that:

$$\frac{V_{rb}-mV_{be}}{R}=\frac{(V_{rb}+\Delta V_{rb})-m(V_{be}+\Delta V_{be})}{R+\Delta R} \quad (3)$$

After cross-multiplying and separating like terms, it can be shown that stable current will result if:

$$\frac{\Delta V_{rb}-m\Delta V_{be}}{V_{rb}-mV_{be}}=\frac{\Delta R}{R} \quad (4)$$

It will be understood that the exact values for the terms $V_{rb}$, $\Delta V_{rb}$, $V_{be}$, $\Delta V_{be}$ and $\Delta R/R$ in the above expressions depend to a large extent upon the semiconductor material employed in the integrated circuit structure and upon the fabrication processes employed. In a monolithic silicon structure, for example, $V_{be}$, the voltage drop of a forward biased junction equals approximately 0.7 volt, while $\Delta V_{be}$, the change in forward voltage drop as a function of temperature, equals approximately 1.75 millivolts per each centigrade degree change. Resistance values in such a structure, additionally, vary about 1.9 parts per 1000 ohms per degree change in centigrade for a 200 ohms per square resistor. Furthermore, an avalanche diode designed, as in the arrangement of FIG. 1, to have a reverse-breakdown voltage of 5.1 volts exhibits a positive temperature coefficient of approximately 1.0 millivolts per each centigrade degree change at a 1 milliampere current flow. Inserting these values into expression (4) and appreciating that the change in forward voltage drop $\Delta V_{be}$ with varying temperature is in a direction opposite to the corresponding change with temperature in reverse-breakdown voltage and resistance, it can be shown that temperature stabilization will be had if $m$, the number of serially coupled diode-connected transistors, were to equal 2.82. Since it is not possible to fabricate a fractional number of transistors, the use of three such diode-connected transistors is intended for the current source of FIG. 1. Such an arrangement provides an operating current in the collector electrode circuit of the transistor 11 which is substantially constant in the presence of temperature variations. As was previously indicated, the use of the avalanche diode 10 serves to isolate the current source from variations in the potential supplied at the terminal 12 and to, therefore, stabilize the operating current in the presence of such potential changes.

The current source shown in FIG. 2 is similar to that of FIG. 1 in that an avalanche diode 10 is employed to provide stable operation independent of supply voltage variations. The current source differs, however, in that a unique transistor feedback stage 200 is substituted for the three series coupled diode-connected transistors used to approximate the 2.82 $V_{be}$ voltage drops described above as providing temperature stabilization. As shown in FIG. 2, the stage 200 includes a pair of transistors 202 and 204. One transistor 202 is arranged in a common emitter type configuration, with its collector electrode connected to the potential terminal 12 via the resistors 16 and 18 and with its emitter electrode connected to the reference terminal 14. The other transistor 204 is arranged in a common collector type configuration, with its collector electrode connected to the operating potential terminal 12 and with its emitter electrode connected to the terminal 14 through a pair of serially coupled resistors 206 and 208. The common junction 210 between the resistors 206 and 208 is coupled by a lead 212 to the base electrode of the transistor 202, the collector electrode of which is also coupled by a lead 214 to the base electrode of the transistor 204. The lead 13 further couples the common junction 210 to the base electrode of the transistor 11. In addition, resistors 206 and 208 are chosen of a value so that sufficient current flows through transistors 202 and 204 to establish full, forward voltage drops across their respective base-emitter junctions.

The feedback stage 200 is of the type disclosed in the pending applicatiton, Ser. No. 680,483, filed Nov. 3, 1967, and entitled Electrical Circuits. In a manner analogous to that described therein, the stage 200 develops a direct voltage across the resistor 208 which is substantially equal to the forward base-to-emitter voltage drop of the transistor 202. Because of the series coupling of resistors 206 and 208, and because of the fact that resistor 208 is so selected that most of the current flow through resistor 206 flows through resistor 208, the voltage developed at the emitter electrode of the transistor 204 is equal to that $V_{be}$ voltage multiplexed by the quantity, one plus the resistance ratio between resistors 206 and 208, with the value of resistor 206 being in the numerator and with the value of the resistor 208 being in the denominator. Since the base electrode of the transistor 204 is at a direct voltage one forward base-to-emitter voltage more positive than at its emitter electrode, and since, in an integrated circuit structure, the forward base-to-emitter voltage drops of all transistors are substantially identical, it will be apparent that the direct voltage developed at the end of resistor 18 remote from the junction 20 will equal that $V_{be}$ voltage times the quantity, two plus the aforementioned resistance ratio. By selecting the resistance value of resistor 206 to be 0.82 times the resistance value of resistor 208, as indicated in FIG. 2, the required 2.82 $V_{be}$ voltage drops at the remote end of the resistor 18 will be satisfied. Temperature stabilization will then be effected and the collector current of the transistor 202 (as determined by the resistance value of resistor 18) will equal that of the transistor 11. The correspondency between the 2.82 $V_{be}$ voltage drops in the arrangement of FIG. 2, and the desired 2.82 diode-connected transistors for the current source of FIG. 1, each of which provides one forward $V_{be}$ voltage drop, will be evident.

It will be understood that a resistance ratio other than 0.82 would, in general, be required to provide current stabilization in a circuit environment where any one of the values of $V_{rb}$, $\Delta V_{rb}$, $V_{be}$, $\Delta V_{bc}$, and $\Delta R/R$ are different from that set forth above. It will also be understood that the resistance ratio ultimately selected would be unaffected by temperature variations, since, in an integrated circuit structure, both the resistor 206 and the resistor 208 would change in resistance value by like proportions.

Figure 3:
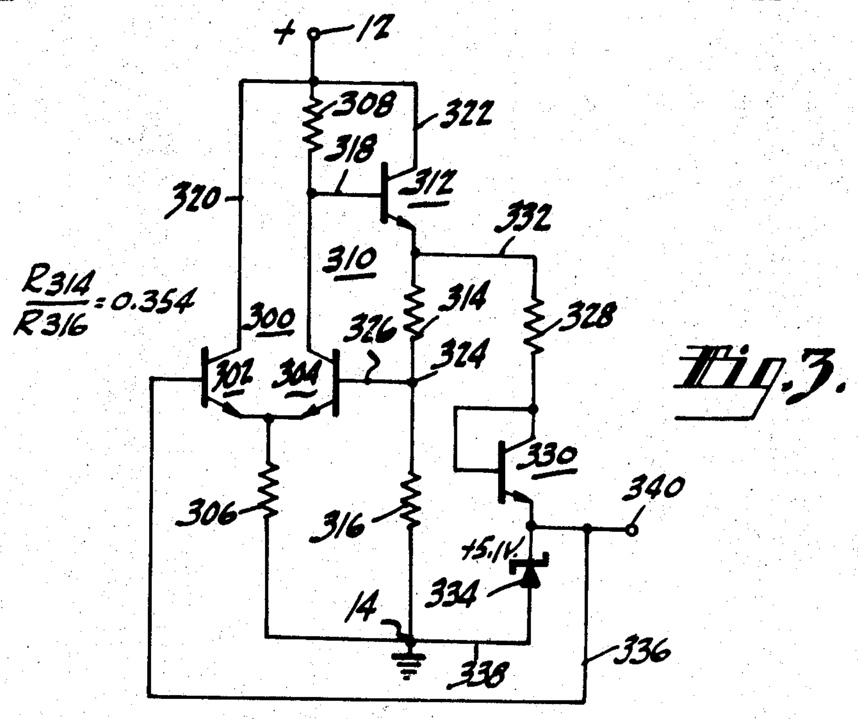
FIG. 3 is a schematic circuit diagram of a regulation circuit useful with the current sources of FIG. 1 and FIG. 2.

The circuit configuration shown in FIG. 3 can be employed with either of the current sources of FIGS. 1 and 2 to further stabilize the operating currents there provided. As will become clear below, this configuration can be used to regulate the current through the avalanche diode 10 of those sources and, in that way, more clearly define the reverse-breakdown voltage $V_{rb}$ of the diode 10, and changes in that breakdown voltage $\Delta V_{rb}$ in the presence of temperature variations.

Referring now, more particularly, to FIG. 3, the regulation configuration there shown includes a differential amplifier 300 and an emitter follower stage 310. The differential amplifier 300 includes transistors 302 and 304 and resistors 306 and 308, while the emitter follower 310 includes transistor 312 and resistors 314 and 316. As shown in the drawing: (a) the emitter electrode of transistors 302 and 304 are connected in common, and are coupled to the ground terminal 14 by means of resistor 306; (b) the collector electrode of transistor 304 is coupled to the operating potential terminal 12 through resistor 308 and, also, to the base electrode of transistor 312 via a lead 318; (c) the collector electrode of transistor 302 is connected via a lead 320 to the terminal 12 while a similar lead 322 connects that same terminal to the collector electrode of transistor 312; and (d) the emitter electrode of that latter transistor 312 is serially coupled to the terminal 14 through resistors 314 and 316, the junction of which 324 is connected to the base electrode of transistor 304 by a lead 326.

The configuration of FIG. 3 also includes a resistor 328 and a diode-connected transistor 330 serially coupled by a lead 332 between the emitter electrode of transistor 312 and an avalanche diode 334 which is referenced to the ground terminal 14 by means of a lead 338. An additional lead 336 is coupled between the junction of the emitter electrode of the diode-connected transistor 330 with the diode 334, and the base electrode of the differential amplifier transistor 302 to complete the regulation circuit. It will be understood that the avalanche diode 334 in FIG. 3 corresponds to the diode 10 in FIGS. 1 and 2, while the remaining circuitry of FIG. 3 can be used as a substitute for the resistor 16 in the current sources shown in those figures. It will be appreciated that the amount of area required to integrate the added component parts in FIG. 3 is acceptably small.

With the arrangement as thus far described, regulation of the reverse-breakdown voltage of the avalanche diode 334 can be had by stabilizing the current through the diode 334 in the presence of temperature changes. This requires that the currents be the same both before and after any such change. Stated mathematically, regulation will result if:

$$\frac{V_E - V_{be_{330}}}{R_{328}} = \frac{V_E + \Delta V_E - V_{be_{330}} - \Delta V_{be_{330}}}{R_{328} + \Delta R_{328}} \quad (5)$$

where $V_E$=the D-C voltage developed at the emitter electrode of transistor 312 less the reverse-breakdown voltage of the avalanche diode 334, in volts;

$\Delta V_E$=the change in that difference voltage $V_E$ as a function of tempearture variations;

$V_{be_{330}}$=the forward base-to-emitter voltage drop of the diode-connected transistor 330, in volts;

$\Delta V_{be_{330}}$=the change in that forward voltage drop with temperature variations;

$R_{328}$=the resistance value of resistor 328, in kilohms; and $\Delta R_{328}$=the change in the resistance of resistor 328 as temperature varies.

After cross-multiplying and separating like terms, it can be shown that stable current will flow through the avalanche diode 334 when $$\frac{\Delta V_E - \Delta V_{be_{330}}}{V_E - V_{be_{330}}} = \frac{\Delta R_{328}}{R_{328}} \quad (6)$$

The change in the difference voltage $\Delta V_E$ between the D-C voltage developed at the emitter electrode of transistor 312 and the reverse-breakdown voltage of the avalanche diode 334, however, is solely dependent upon the voltage variations with temperature of that breakdown voltage. This is due, in part, to the negative feedback action provided by the differential amplifier 300, the emitter follower stage 310, and the leads 326 and 336, which, together, stabilize the D-C voltage at the junction 324 at a value equal to the reverse-breakdown voltage of the diode 334. With resistor 316 further selected so that the base current of transistor 304 is small compared to the current through the series combination of resistors 314 and 316, it can be shown that the D-C voltage at the emitter electrode of transistor 312 is given by $$\frac{R_{314}+R_{316}}{R_{316}} V_{rb_{334}}$$

and that the difference between that voltage and the reverse-breakdown voltage of the avalanche diode 334 is given by $$\frac{R_{314}}{R_{316}} V_{rb_{334}}$$

It will be understood that this latter fraction equals the term $V_E$ in expression (6), that $R_{314}$ and $R_{316}$ respectively represent the resistance values of resistors 314 and 316, and that $V_{rb_{334}}$ represents the reverse-breakdown voltage of the diode 334. Since the ratio $R_{314}/R_{316}$ is unaffected by temperature variations in an integrated circuit environment, it follows that the change in the difference voltage $\Delta V_E$ with temperature equals $$\frac{R_{314}}{R_{316}} \Delta V_{rb_{334}}$$

where $\Delta V_{rb_{334}}$ represents the change in the avalanche diode's reverse-breakdown voltage as the temperature varies. Substituting the fractions for $V_E$ and $\Delta V_E$ in expression (6), there results the fact that stable current will flow through the avalanche diode 334 when $$\frac{\frac{R_{314}}{R_{316}} \Delta V_{rb_{334}} - \Delta V_{be_{330}}}{\frac{R_{314}}{R_{316}} V_{rb_{334}} - V_{be_{330}}} = \frac{\Delta R_{328}}{R_{328}} \quad (7)$$

Assuming that the regulation circuit of FIG. 3 is also incorporated in a monolithic silicon integrated circuit chip—where $V_{be330}$=0.7 volt, $\Delta V_{be330}$=1.75 millivolts per centigrade degree temperature changes, $\Delta R/R$=1.9 parts per thousand ohms per degree centigrade change—and that the avalanche diode 334 is once again designed to have a reverse-breakdown voltage of 5.1 volts and a positive temperature coefficient of approximately 1.0 millivolts per each centigrade degree change at a 1 milliampere current flow, current stabilization will be had if $R_{314}/R_{314}$=0.354. Choice of such a resistance ratio for resistors 314 and 316 thus establishes the difference voltage $V_E$ between the emitter electrode of transistor 312 and the reverse-breakdown voltage of the avalanche diode at a value substantially equal to 1.80 volts.

It will be appreciated that the low impedance of the avalanche diode 334 in FIG. 3 degenerates the positive feedback from the emitter electrode of transistor 312 to the base electrode of transistor 302, so as to prevent the circuit from oscillating.

Figure 4:
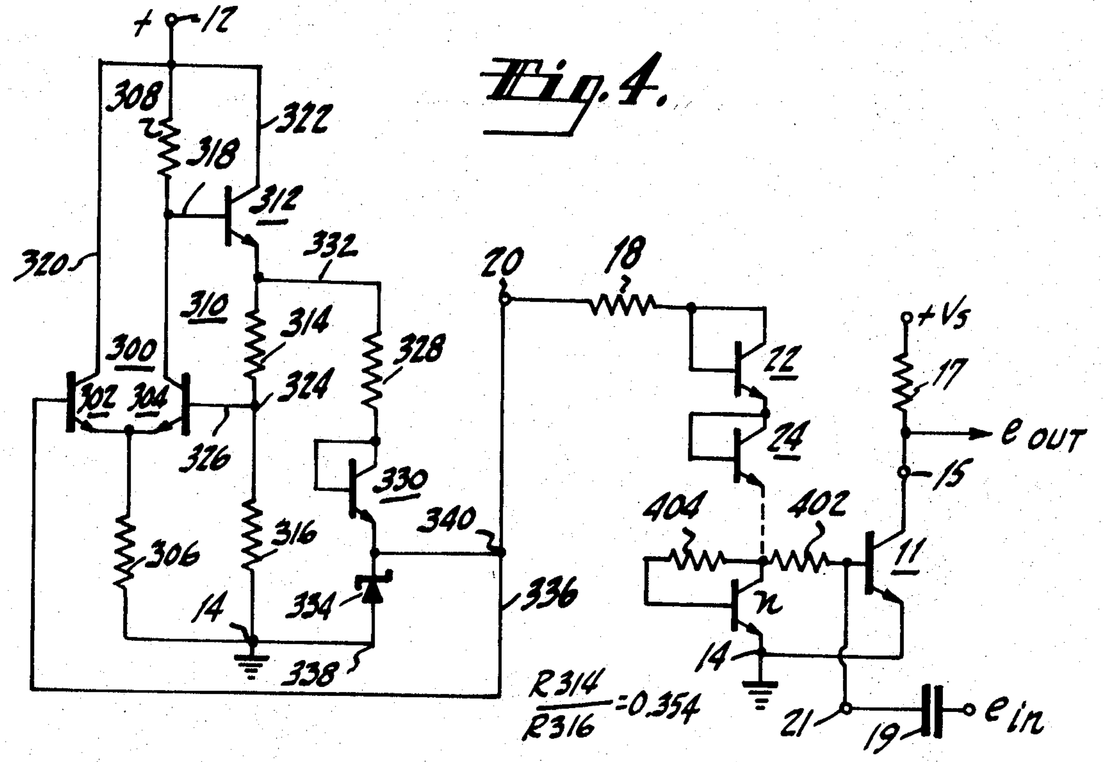
FIGS. 4 and 5 are schematic circuit diagrams of common emitter amplifier stages employing the current sources of FIGS. 1 and 2, respectively.
Figure 5:
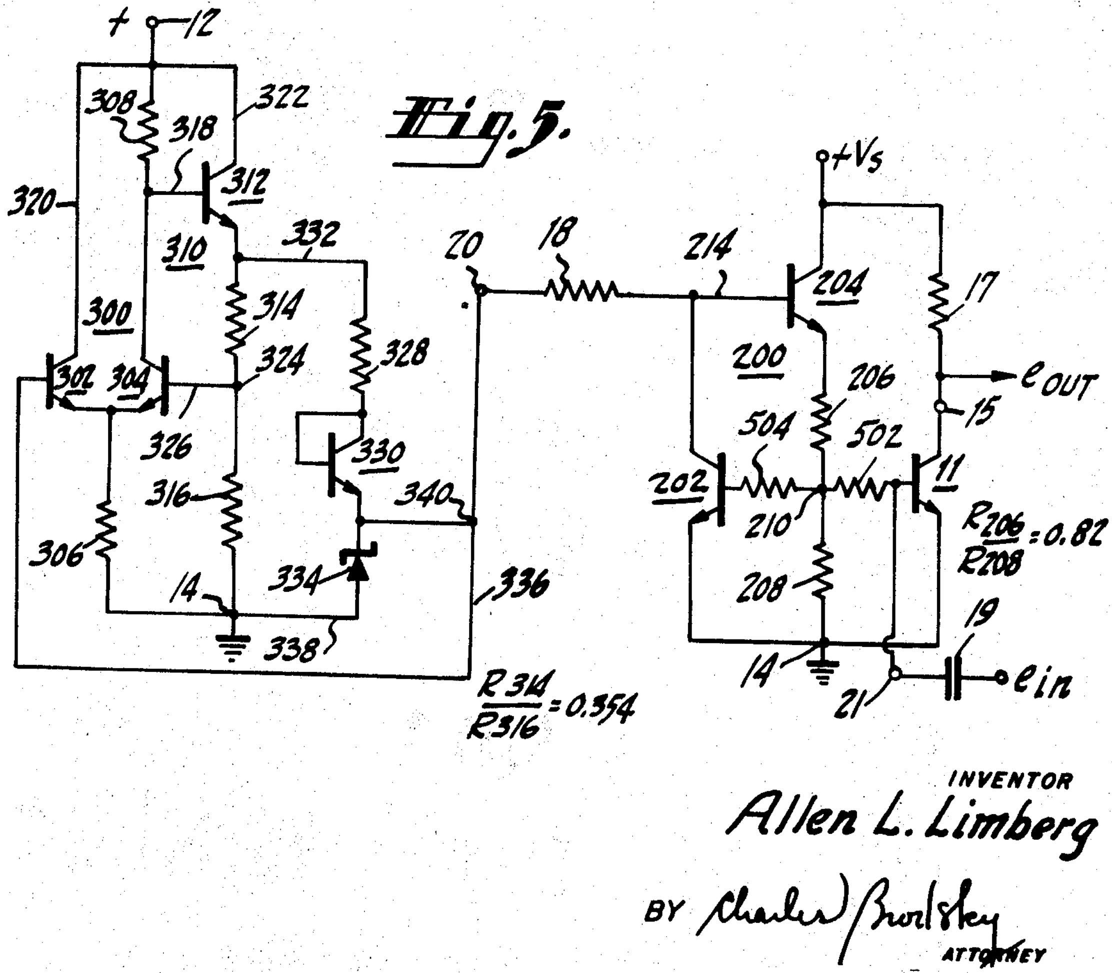

The avalanche diode 334 is shown in FIG. 3 as being connected to an output point 340. This point is intended for connection to the junction 20 in either FIG. 1 or FIG. 2 when the regulation circuit of FIG. 3 is used to further the current stabilization there provided. Such connections are respectively shown in FIGS. 4 and 5, with the current source portions thereof being modified slightly for use as common emitter amplifier stages. In FIG. 4, for example, a pair of equal valued resistors 402 and 404 are added to respectively couple the collector electrode of the transistor *n* to the base electrode of the transistor 11 and to its own base electrode, with the input signals to be amplified being applied via a capacitor 19 and a terminal 21 to the base electrode of transistor 11. In FIG. 5, on the other hand, equal valued resistors 502 and 504 are added to couple the junction point 210 to the base electrodes of transistors 11 and 202, respectively, with the input signals again being applied to transistor 11 by means of the capacitor 19 and the terminal 21. A load 17, shown as a resistor, is additionally coupled to the output point 15 of the current sources in each of these figures, to develop the amplified signals. The resistors 402 and 502, in each case, serve to increase the input impedance presented to the applied signals so that amplification can be effected, while the resistors 404 and 504 serve to provide symmetrical biasing so that identical valued direct currents flow in the transistors *n* and 11, and in transistors 202 and 11. In this respect it will be appreciated that very little current flows through the resistor 404 in FIG. 4 to alter previously described current source operations, and that rectifier type action continues to be provided by the transistor *n* since its base bias voltage is provided from its collector electrode circuit.

Bias stabilization can be achieved in each such circuit, as before, by the expedient of using an easily calculable number of semiconductor junction voltage drops to offset temperature dependencies, rather than by using a more complex and limited arrangement as was previously the case. Rearranging the terms in expression (4), it can be shown that this number of semiconductor junction voltage drops required is substantially given by:

$$m=\frac{V_{rb}-\frac{R}{\Delta R}\Delta V_{rb}}{V_{be}-\frac{R}{\Delta R}\Delta V_{be}} \quad (8)$$

It will also be apparent, that voltage regulating schemes other than that employed in FIGS. 1, 2, 4 and 5 may be used in such circuits, but they would, in general, require a different number of forward biased semiconductor junction voltage drops to achieve current stabilization. This would follow since, the temperature dependencies exhibited in each such scheme would generally vary from one to another.

What is claimed is:

1. An electrical circuit comprising:
a resistor having a value which is dependent upon environmental temperatures within said circuit;
first means, adapted for coupling to a source of voltage, for applying to one end of said resistor a direct voltage which is substantially constant in the presence of voltage variations of said source and which varies as a function of changes in said environmental temperatures;
and second means, serially coupled from the other end of said resistor to a point of reference voltage, for providing voltage between said other end said point equal to a predetermined number of forward biased semiconductor junction voltage drops which voltage varies with temperature in a manner to maintain substantially constant current flow within said second means by offsetting any changes in current flow tending to be produced therein due to variations in said resistor value and said direct voltage resulting from said temperature changes.

2. An electrical circuit as defined in claim 1 wherein said resistor, said first means, and said second means are all disposed in a single integrated circuit device and wherein there is additionally included within said electrical circuit, and within said integrated device, a transistor having a base-emitter input circuit coupled to said second means and a collector output circuit in which there flows a temperature stabilized current substantially equal in magnitude to the current flowing within said second means.

3. An electrical circuit comprising:
a resistor having a value which is dependent upon environmental temperatures within said circuit;
a source of unregulated supply voltage;

first means coupled to said source for applying to one end of said resistor a direct voltage which is substantially constant in the presence of supply voltage variations and which varies as a function of changes in said environmental temperatures;
and second means, serially coupled between the other end of said resistor and a point of reference voltage, for providing a predetermined number of forward biased semiconductor junction voltage drops which vary with temperature in a manner to stabilize current flow within said second means by offsetting any changes in current flow tending to be produced therein due to variations in said resistor value and said direct voltage resulting from said temperature changes;
said resistor, said first means, said second means, and said point of reference voltage all being disposed in a single integrated circuit device, and
said second means including a predetermined number of transistors having their collector electrode-emitter electrode current paths serially coupled between said other end of said resistor and said point of reference voltage, and having their base and collector electrodes connected in common.

4. An electrical circuit comprising:
a resistor having a value which is dependent upon environmental temperatures within said circuit;
a source of unregulated supply voltage;
first means coupled to said source for applying to one end of said resistor a direct voltage which is substantially constant in the presence of supply voltage variations and which varies as a function of changes in said environmental temperatures;
and second means, serially coupled between the other end of said resistor and a point of reference voltage, for providing a predetermined number of forward biased semiconductor junction voltage drops which vary with temperature in a manner to stabilize current flow within said second means by offsetting any changes in current flow tending to be produced therein due to variations in said resistor value and said direct voltage resulting from said temperature changes;
said resistor, said first means and said second means all being disposed in a single integrated circuit device, and
said second means including:
a first transistor connected in a common emitter amplifier configuration;
a second transistor connected in a common collector amplifier configuration; and
means including a pair of resistors of predetermined ratio interconnecting said transistors in a degenerative feedback loop to provide a reference voltage for said common collector amplifier from said common emitter amplifier at said other end of said resistor.

5. An electrical circuit comprising:
a resistor having a value which is dependent upon environmental temperature within said circuit;
a source of unregulated supply voltage;
first means coupled to said source for applying to one end of said resistor a direct voltage which is substantially constant in the presence of supply voltage variations and which varies as a function of changes in said environmental temperatures;
and second means, serially coupled between the other end of said resistor and a point of reference voltage for providing a predetermined number of forward biased semiconductor junction voltage drops which vary with temperature in a manner to stabilize current flow within said second means by offsetting any changes in current flow tending to be produced therein due to variations in said resistor value and said direct voltage resulting from said temperature changes;

said resistor, said first means, said second means, and said point of reference voltage all being disposed in a single integrated circuit device;

said first means including an avalanche diode, and the predetermined number of forward biased semiconductor junction voltage drops provided by said second means is substantially given by the expression:

$$m=\frac{V_{rb}-\frac{R}{\Delta R}\Delta V_{rb}}{V_{be}-\frac{R}{\Delta R}\Delta V_{be}}$$

where $m$=the number of forward biased semiconductor junction voltage drops;

$V_{rb}$=the reverse-breakdown voltage of the avalanche diode;

$\Delta V_{rb}$=the variation in said reverse breakdown voltage with temperature changes;

$V_{be}$=the voltage drop of each of said forward biased semiconductor junctions;

$\Delta V_{be}$=the variation in said voltage drop with temperature changes;

R=the resistance value of said resistor; and $\Delta R$=the variation in said resistance value with temperature changes.

6. An electrical circuit as defined in claim 5 wherein the predetermined number of forward biased semiconductor junction voltage drops provided by said second means is provided by a plurality of transistors having their collector electrode-emitter electrode current paths serially coupled between said other end of said resistor and said point of reference voltage, and having their base and collector electrodes connected in common, said plurality of transistors being substantially equal in number to the nearest integral of said predetermined number of forward biased semiconductor junction voltage drops.

7. An electrical circuit as defined in claim 5 wherein the predetermined number of forward biased semiconductor junction voltage drops is provided by:

a first transistor connected in a common emitter amplifier configuration;

a second transistor connected in a common collector amplifier configuration; and means including a pair of resistors of predetermined ratio interconnecting said transistors in a degenerative feedback loop to provide a reference voltage for said common collector amplifier from said common emitter amplifier at said other end of said resistor, the ratio between said pair of resistors being substantially equal to two less than said predetermined number of semiconductor junction voltage drops.

8. An electrical circuit comprising:

an operating potential terminal;

a reference potential terminal;

a first resistor and an avalanche diode serially coupled between said operating and reference potential terminals;

a second resistor having one end coupled to the junction between said first resistor and said avalanche diode;

and a predetermined number of transistors having their collector electrode-emitter electrode current paths serially coupled between the other end of said second resistor and said reference potential terminal, and having their base and collector electrodes connected in common, said predetermined number being substantially equal to the nearest integral of the fraction:

$$\frac{V_{rb}-\frac{R}{\Delta R}\Delta V_{rb}}{V_{be}-\frac{R}{\Delta R}\Delta V_{be}}$$

where $V_{rb}$=the reverse-breakdown voltage of the avalanche diode;

$\Delta V_{rb}$=the variation in said reverse-breakdown voltage with temperature changes;

$V_{be}$=the forward base-to-emitter electrode voltage drop of each of said transistors;

$\Delta V_{be}$=the variation in said forward voltage drop with temperature changes;

R=the resistance value of said second resistor; and $\Delta R$=the variation in said resistance value with temperature changes.

9. An electrical circuit as defined in claim 8 wherein said first and second resistors, said avalanche diode and said predetermined number of transistors are all disposed in a single integrated circuit device, wherein there is also included within said electrical circuit, and within said electrical circuit, and within said integrated device, a transistor having a base-emitter junction coupled across the base-emitter junction of the one of said predetermined number of transistors closest to said reference potential terminal, and wherein there is additionally included an output circuit coupled to the collector electrode of said transistor in which there flows a temperature stabilized current substantially equal in magnitude to the current flowing through said one of said predetermined number of transistors.

10. An electrical circuit comprising:

a resistor having a value which is dependent upon environmental temperatures within said circuit;

a source of supply voltage coupled to one end of said resistor;

and means, serially coupled from the other end of said resistor to a point of reference voltage, for providing voltage between said other end and said point equal to a predetermined number of forward biased semiconductor junction voltage drops which voltage varies with temperature in a manner to maintain substantially constant current flow within said means by offsetting any changes in current flow tending to be produced therein due to variations in said resistor value.

References Cited

UNITED STATES PATENTS

| | | | |
|---|---|---|---|
| 2,716,729 | 8/1955 | Shockley | 323—22 X |
| 3,246,233 | 4/1966 | Herz | 323—4 |
| 3,345,553 | 10/1967 | Schermann | 323—4 |

J D MILLER, Primary Examiner

A. D. PELLINEN, Assistant Examiner

U.S. Cl. X.R.

307—297